United States Patent [19]

Matsumura et al.

[11] Patent Number: 4,985,097
[45] Date of Patent: Jan. 15, 1991

[54] JOINED METAL COMPOSITE AND METHOD FOR PRODUCTION THEREOF

[75] Inventors: Kazuo Matsumura, Kawasaki; Mitsuhiro Nagata, Yokohama; Tadashi Tanaka, Matsudo, all of Japan

[73] Assignee: Kabushiki Kaisha Toshiba, Kanagawa, Japan

[21] Appl. No.: 368,166

[22] Filed: Jun. 16, 1989

Related U.S. Application Data

[60] Division of Ser. No. 171,451, Mar. 21, 1988, abandoned, which is a continuation-in-part of Ser. No. 910,970, Sep. 24, 1986.

[30] Foreign Application Priority Data

Sep. 26, 1985 [JP] Japan .................. 60-211056

[51] Int. Cl.$^5$ .................................. B32B 31/00
[52] U.S. Cl. ...................... 156/87; 156/89; 156/257
[58] Field of Search ........... 427/256, 257, 287, 383 S; 428/573, 575, 615, 620, 621, 627, 632; 228/122, 124, 174, 198, 903; 156/87, 89, 257

[56] References Cited

U.S. PATENT DOCUMENTS

| | | | |
|---|---|---|---|
| 2,638,430 | 5/1953 | Mann | 156/295 |
| 3,994,430 | 11/1976 | Cusano | 228/122 |
| 4,409,278 | 10/1983 | Jochym | 428/163 |
| 4,505,418 | 3/1985 | Neidig et al. | 228/122 |
| 4,591,401 | 5/1986 | Neidig et al. | 156/89 |

FOREIGN PATENT DOCUMENTS

2099742A 12/1982 United Kingdom.

Primary Examiner—Stanley Silverman
Attorney, Agent, or Firm—Finnegan, Henderson, Farabow, Garrett and Dunner

[57] ABSTRACT

Disclosed is a joined ceramic-metal composite having a copper sheet directly joined to a ceramic substrate and a method for the production thereof. This composite is characterized by having a plurality of parallel grooves formed on the surface of the copper sheet to be joined to the ceramic substrate. The products of this invention show substantially none of the defects such as blisters inflicated on the copper sheet during the course of union by heating and, therefore, serve advantageously as ceramic circuit substrates for use in transistor modules, for example.

4 Claims, 1 Drawing Sheet

JOINED METAL COMPOSITE AND METHOD FOR PRODUCTION THEREOF

The present application is a division of Ser. No. 171,451, filed Mar. 21, 1988, which is a continuation-in-part of U.S. patent application Ser. No. 910,970 filed on Sept. 24, 1986.

The present application claims priority of Japanese Patent Application No. 60-211,056 filed on Sept. 26, 1985.

FIELD OF THE INVENTION AND RELATED ART STATEMENT

This invention relates to a jointed ceramic-metal composite having a copper sheet directly joined to a ceramic substrate and to a method for the production thereof.

In recent years, as ceramic circuit boards which are intended for substrates in transistor modules, for example, there have been developed the so-called DBC (Direct Bonded Copper) substrates which are obtained by disposing a copper sheet destined to form conductor circuits at a stated position on a ceramic substrate and directly joining them by heating to a temperature not exceeding the melting point of copper (1,083° C.) and exceeding the eutectic point of copper and oxygen (1,065° C.). In the DBC substrates, since the ceramic substrates are heavily warped or they are deformed during application of heat for the purpose of union and, consequently, the gas emanating from the ceramic substrates or copper sheets are entrapped in the interfaces between the ceramic substrates and copper sheets, the copper sheets sustain fine blisters in part thereof and give rise to portions of insufficient union in the produced composites. When these blisters grow to a size exceeding a certain level, they entail a problem that the DBC substrates will not permit silicon semiconductor chips to be easily mounted thereon and the yield of the products will be poor consequently. There is another problem that even when the chips are mounted at all, the chips have poor adhesion and suffer from inferior thermal conductivity.

Jochym (U.S. Pat. No. 4,409,278) has disclosed a directly joined metal-substrate composite in a blister-free construction owing to interposition of venting channels between the contiguous surfaces of the metal sheet and the substrate. Since the channels are formed either mechanically by the action of grinding or chemically by the action of etching with an etchant, they are not fully satisfactory from the practical point of view. Indeed, the device is effectively in diminishing the occurrence of blisters, the effect is not necessarily sufficient. Neidig (U.S. Pat. No. 4,505,418) has disclosed use of a vacuum furnace for joining a copper foil to a ceramic substrate under a vacuum. This method is quite deficient in productivity and, therefore, is economically infeasible. Neidig (U.S. Pat. No. 4,591,401) has further disclosed a joined metal-ceramic composite produced by preparing a metal sheet having a plurality of parallel grooves 3 to 10 microns in both depth and width formed on one surface and a ceramic substrate having a roughened surface and joining them fast on the processed surfaces. Though this method evidently tends toward diminishing the occurrence of blisters, the diminution attained at all is not fully satisfactory. The grooves continue to retain empty spaces between the metal sheet and the ceramic substrate even after their mutual adhesion. These grooves impede conduction of heat through the produced composite and increase thermal resistance thereof. When a pattern is formed by etching on the joined ceramic-metal composite as a substrate, the etchant used therein enters the empty spaces in the grooves and, at the time that a pellet is mounted on the substrate, impedes the pellet from being safely soldered thereto. The remaining etchant is suffered to corrode the copper sheet even to the extent of disrupting the mutual adhesion of the ceramic subsrate and the copper sheet and extremely intensifying thermal resistance and possibly entailing a trouble.

OBJECT AND SUMMARY OF THE INVENTION

This invention has been produced for the solution of the problem above. An object of this invention is to provide a joined ceramic-metal composite substrate which can be produced in high yield without entailing occurrence of blisters in the interface.

Another object of this invention is to provide a joined ceramic-metal composite substrate enjoying highly satisfactory thermal conductivity and enabling subsequent treatments such as the mounting of a chip thereon to be carried out without entailing any noteworthy trouble and a method for the production thereof. To be specific, this invention is directed to a joined ceramic-metal composite substrate comprising a ceramic substrate and a copper sheet directly joined to one surface, or to each of the opposite surfaces, of the ceramic substrate, which composite substrate is produced by preparatorily forming grooves by plastic molding on the surface of the copper sheet destined to contact the ceramic substrate, superposing the copper sheet containing the grooves and the ceramic substrate on each other, and heating the superposed layers at a temperature in the range of 1,065° to 1,083° C. The produced composite substrate contains no gap in the interface between the copper sheet and the ceramic substrate and consequently precludes occurrence of blisters and, therefore, enjoys highly satisfactory thermal conductivity.

As examples of the ceramic substrate to be used in the present invention, there can be cited substrates of oxide type ceramics such as alumina and beryllium oxide and substrates of non-oxide type ceramics such as aluminum nitride and silicon nitride. When a non-oxide type ceramic substrate is used, it is desirable that the surface of the substrate to be joined should be given an oxidizing treatment in advance of the union to ensure fastness of the union. To preclude the occurrence of blisters, the warp possibly inflicted on the ceramic substrate is desired to be not more than 20 $\mu$m/50 mm. To ensure this preclusion, it is desirable that the ceramic substrate to be used should be given a specular polishing and then a whet honing in advance of the union.

The copper sheet to be used is desired to be made of oxygen-free copper or tough pitch copper having an oxygen content in the range of 100 to 2,000 ppm, preferably 200 to 500 ppm. The practical thickness of the copper sheet is in the range of 0.03 to 0.5 mm.

In the present invention, the formation of grooves on the surface of the copper sheet is carried out mechanically by the work of stamping, for example. These grooves have a width in the range of 0.01 to 3 mm, preferably 0.5 to 1.0 mm, and a depth exceeding neither 0.1 mm nor one half of the thickness of the copper sheet, preferably exceeding 0.020 mm and not exceeding 0.080 mm. These grooves are separated by a fixed pitch, i.e. the distance between the center lines of the adjacent grooves, falling in the range of 1 to 25 mm. All these dimensions are suitably selected, depending on the size of the copper sheet to be used. The aforementioned grooves produced through plastic deformation by the work of stamping are flattened out by the heat to be used during the course of the joining. At the time that the copper sheet having the aforementioned grooves formed thereon is joined to the ceramic substrate, the oxygen evolved from the copper sheet finds the way out through these grooves, precluding the otherwise possible occurrence of blisters. At the same time, the grooves produced through plastic deformation by the work of stamping are recovered and eventually flattened out by the intense heat used during the course of the joining. As a result, the gap between the ceramic substrate and the copper sheet ceases to exist.

Union of the ceramic substrate to the copper sheet is carried out, for example, as follows.

The copper sheet is disposed at a stated position on the ceramic substrate. The components, as held in the superposed state, are heated in a non-oxidizing atmosphere or, when the copper sheet is made of oxygen-free copper, in an oxidizing atmosphere containing a very small amount of oxygen, at a temperature in the range of 1,065° to 1,083° C., preferably 1,070° to 1,075° C. Suitably, the heating time is in the range of 2 to 30 minutes. After the heating thus conducted, they are cooled to complete a joined ceramic-metal composite.

DETAILED DESCRIPTION OF THE PREFERRED EMBODIMENT

Figure 1:
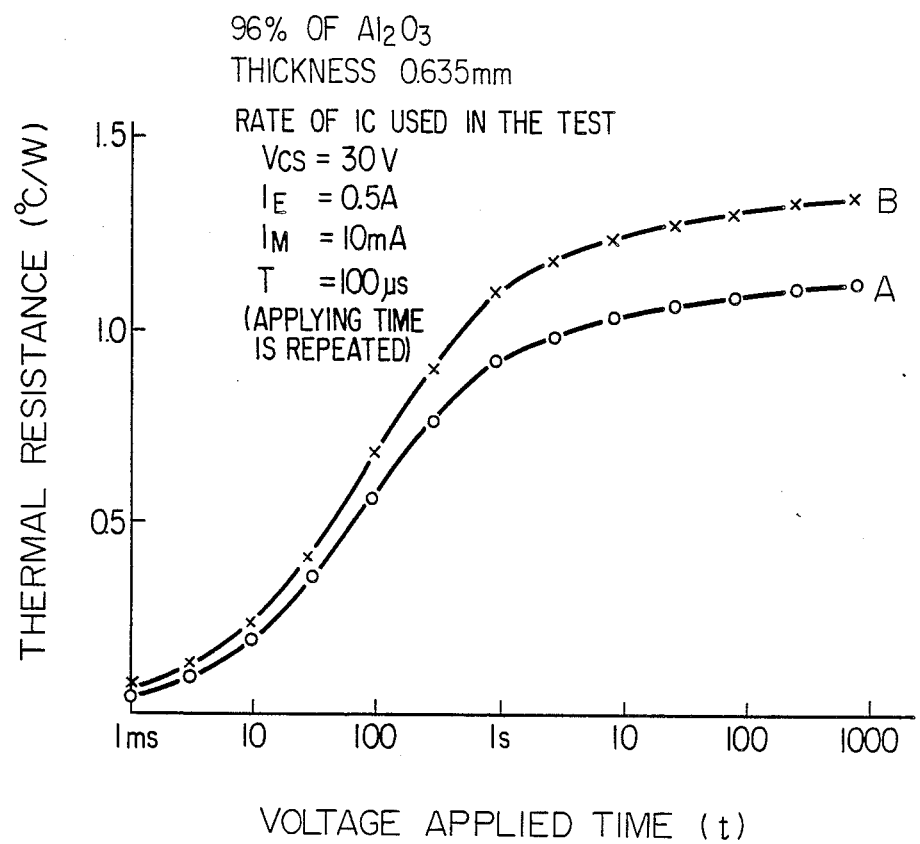
FIG. 1 illustrates typical results of a test heat-resistance characteristics performed on a DBC substrate according to the present invention and on a DBC substrate according to the conventional method.

Now, the present invention will be described with reference to a working example.

EXAMPLE 1

A crude alumina ceramic substrate was given a specular polishing with a diamond grindstone, #800, and then a whet honing to produce a ceramic substrate 1 measuring 35 mm in width, 55 mm in length, and 0.6 mm in thickness as illustrated in the drawing. The warp of this ceramic substrate 1 was 5.0 μm in the direction of length and 2.5 μm in the direction of width.

Separately, a metallic mold possessing a single projection tapering at an angle of 120° at the leading end thereof and measuring 100 mm in length was prepared, fixed on a rotary press for high-speed operation, and used to form grooves on a copper sheet 0.5 mm in thickness. The copper sheet used in this case was made of tough pitch copper (oxygen content about 300 ppm) having a tensile strength of not more than 30 kgf/mm$^2$, an elongation of not less than 20%, and a Vickers hardness of not less than 105 Hv. The grooves measured 0.3 mm in width and 0.1 mm in depth and were separated with pitches of 2 mm. Since it was difficult to form grooves in a fixed depth, grooves were formed with a stopper between the metallic die and the copper sheet so as to ensure impartation of a uniform depth to the grooves. A rectangular piece 30 mm in width and 55 mm in length was punched out of the copper sheet, superposed on the aforementioned ceramic substrate, heated in a current of nitrogen at about 1,075° C. for three minutes, and then cooled to room temperature.

The DBC substrate produced as described above showed no prominence indicative of occurrence of blisters. The gaps formed by the grooves between the ceramic substrate and the copper sheet were no longer present.

The joined ceramic-metal composite obtained as described above was found to form substantially no blister therein. The ratio of occurrence of blisters exceeding 4 mm in diameter was 0%.

EXAMPLE 2

An alumina ceramic substrate 37 mm in width, 55 mm in length, and 0.635 mm in thickness was prepared with Al$_2$O$_3$ of a purity of 96 % by following the procedure of Example 1. A copper sheet 0.3 mm in thickness, 34 mm in width, and 52 mm in length was prepared with tough pitch copper (oxygen content 300 ppm) having a tensile strength of 26.0 kgf/mm$^2$, an elongation of 33.0%, and a Vickers hardness of 85 Hv. On this copper sheet, grooves were formed by the same method as in Example 1. The grooves measuring 0.1 mm in width and 0.03 mm in depth and were separated with pitches of 2 mm. The ceramic substrate and the copper sheet containing the aforementioned grooves were superposed on each other, heated in a current of nitrogen at a temperature of 1,073° C. for 20 minutes, and then cooled.

COMPARATIVE EXPERIMENT

For comparison, the formation of grooves was effected by etching. On a copper sheet of the same material and the same size as in Example 2, grooves 0.13 mm in width and 0.03 mm in depth were formed by etching as separated with pitches of 1 mm. The copper sheet thus containing the grooves and a ceramic substrate were joined by following the procedure of Example 2.

The samples of Example 2 and Comparative Experiment were tested for heat resistance with an IC pellet (5 mm × 5 mm) mounted on the copper sheet side surface. The samples were kept under observation during the formation of a pattern to detect a sign of possible exudation of etchant.

RESULTS OF COMPARATIVE TEST

The test for heat resistance was carried out as follows.

An electric current, 30 V and 500 mA in magnitude, was applied to the IC pellet on the sample for a fixed duration. Thereafter, the voltage between the base and the emitter was measured with a testing current of 10 mA. The results were as shown in FIG. 1.

As concerns heat resistance, the DBC substrate produced by the procedure of Example 2 of this invention using the copper sheet having grooves formed thereon by the work of stamping with a metallic die exhibited a small magnitude of heat resistance as compared with the DC substrate produced by the procedure of Comparative Experiment using the copper sheet having grooves formed thereon by etching. This difference in heat resistance increased in proportion as the duration of the application of electric current increased.

Then a wiring pattern was formed by etching on the DBC substrate and an IC chip was joined thereto with solder (composed of 90% of Sn and 10% of Pb) at 300° to 400° C. The DBC module thus completed was examined as to outward appearance. By this procedure, a total of 100 samples were prepared each to represent the products of Example 2 and Comparative Experiment. Absolutely no sign of exudation of the etchant was observed in any of the samples of Example 2. Signs of exudation of the etchant were detected in 30 of 100 samples of Comparative Experiment. The occurrence of exudation of the etchant in the product of Comparative Experiment may be logically explained by a supposition that the product contained gaps (grooves) between the ceramic substrate and the copper sheet and the etchant remained in the gaps and exuded to the surface during the course of the soldering performed at an elevated temperature exceeding 300° C. The remaining etchant gradually corroded the sheet to disrupt the mutual adhesion of the ceramic substrate and the copper sheet, aggravate heat resistance extremely, and induce a physical trouble.

The DBC substrate obtained by the method of the present invention produces substantially no blister. In the DBC substrate in its unmodified form, no gap occurs between the ceramic substrate and the copper sheet. During the course of the mounting of an IC chip thereon, therefore, this DBC substrate exhibits far better thermal properties than the conventional countertype. At the time that a wiring pattern is formed thereon by etching, no etchant is suffered to remain in the DBC substrate. The DBC substrate of this invention cannot suffer from the trouble causable by remaining etchant.

Since the joined ceramic-metal composite of this invention permits the oxygen gas emanating from the copper sheet to be released from the composite through the grooves, it can be prevented from producing blisters therein. Since blisters are liable to occur in the central part of the composite, the grooves may be formed in a radial pattern.

The frequency of the occurrence of blisters in the composite can be further decreased by using a ceramic substrate the warp of which is amply lower than the tolerable level.

What is claimed is:

1. A method for the production of a joined ceramic-copper composite substrate comprising a ceramic substrate and a copper sheet directly joined to one or each of opposite surfaces of said ceramic substrate and containing no gap in an interface between said ceramic substrate and said copper sheet, which method comprises the steps of preparing said copper sheet by forming on the surface thereof for contact with said ceramic substrate a plurality of grooves produced by plastic deformation, whereby said grooves may be subsequently recovered and flattened out at an elevated temperature, superposing said ceramic-copper composite substrate with the grooved surface of said copper sheet held contiguously to said ceramic substrate, heating the superposed layers at a temperature in the range of 1,065° to 1,083° C. thereby joining said ceramic substrate and said copper sheet by fusion and recovering and flattening out said grooves, and cooling the hot composite consequently formed.

2. The method according to claim 1, wherein said copper sheet containing said plurality of grooves is formed with a wall thickness in the range of 0.03 to 0.5 mm with tough pitch copper having an oxygen content in the range of 200 to 500 ppm and possesses tensile strength of not more than 30 kgf/mm$^2$, an elongation of not less than 20%, and a Vickers hardness of not more than 105 Hv.

3. The method according to claims 1 or 2, wherein said plurality of grooves on the surface of said copper sheet are disposed substantially parallel to one another and possess a width in the range of 0.01 to 3 mm and a depth in the range of 0.1 to 0.01 mm and are separated by a distance of 1 to 25 mm.

4. The method according to claim 1, wherein said plurality of grooves are produced by stamping.

* * * * *